United States Patent [19]
Clark et al.

[11] Patent Number: 5,103,329
[45] Date of Patent: Apr. 7, 1992

[54] SURFACE STABILIZED FERROELECTRIC LIQUID CRYSTAL SWITCHING USING PROXIMITY EFFECTS

[75] Inventors: Noel A. Clark; Mark Handschy, both of Boulder, Colo.

[73] Assignee: University of Colorado Foundation, Inc., Boulder, Colo.

[21] Appl. No.: 687,463

[22] Filed: Apr. 19, 1991

[51] Int. Cl.$^5$ .............................. G02F 1/13
[52] U.S. Cl. ...................... 359/56; 359/89; 359/100
[58] Field of Search ............ 350/332, 333, 334, 350 S; 340/784; 341/26, 33

[56] References Cited

U.S. PATENT DOCUMENTS

| | | | |
|---|---|---|---|
| 4,367,924 | 1/1983 | Clark et al. | 350/350 S |
| 4,815,035 | 3/1989 | Brooks | 350/332 X |
| 4,954,823 | 9/1990 | Binstead | 341/26 |

Primary Examiner—Stanley D. Miller
Assistant Examiner—Huy K. Mai
Attorney, Agent, or Firm—Cushman, Darby & Cushman

[57] ABSTRACT

An electro-optic shift register uses proximity effects to propagate data more efficiently. The apparatus includes a pair of conducting planes separated by a plane spacing, whereby one of the conducting planes includes a plurality of electrodes having an electrode gap narrower than the plane spacing. A Surface Stabilized Ferroelectric Liquid Crystal is located between the conducting planes with a thickness sufficient to enable the formation of a domain wall between the pixels corresponding with the electrodes. The resulting domain wall also overlaps the pixels and the corresponding electrodes. The domain wall provides a desirable proximity effect by overlapping regions having nonzero electrostatic potential. A three-phase timing sequence ensures the domain wall propagates in a single direction.

16 Claims, 8 Drawing Sheets

PHASE 1 (PRIOR ART)

PHASE 2 (PRIOR ART)

PHASE 3 (PRIOR ART)

PHASE 1 (PRIOR ART)

PHASE 2 (PRIOR ART)

PHASE 3 (PRIOR ART)

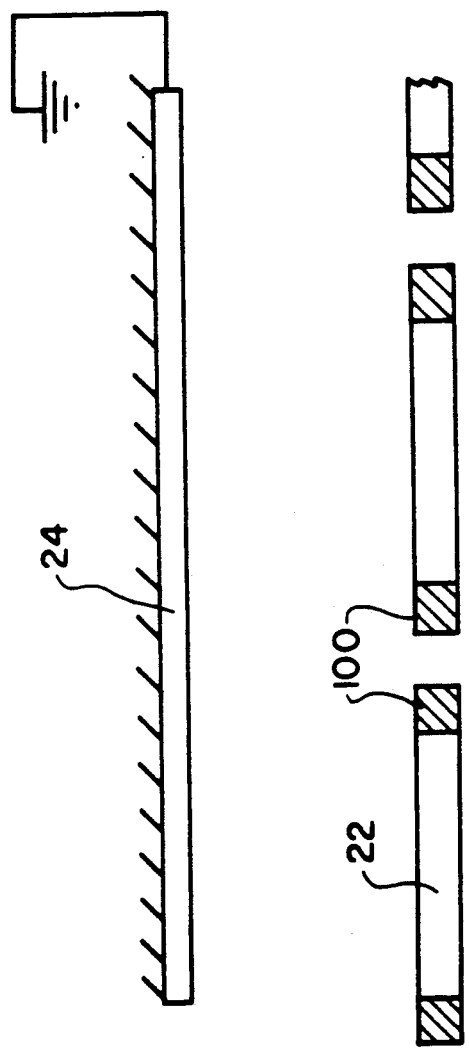

SURFACE STABILIZED FERROELECTRIC LIQUID CRYSTAL SWITCHING USING PROXIMITY EFFECTS

BACKGROUND OF THE INVENTION

1. Field of the Invention

The present invention relates to the use of surface stabilized ferroelectric liquid crystals (SSFLC) for electro-optic light valves having one of two stable states. In particular, the present invention relates to using SSFLCs for electro-optic shift registers.

2. Description of the Related Art

Liquid crystal devices (LCD) have found prominent use in non-emissive electro-optic display applications because of their unique characteristics including low voltage and low power operation. These applications include the development of flat-panel displays used in computer terminals, oscilloscopes, radar and television screens.

Improvements have been made to provide a faster, polarity sensitive electro-optical device. For example, U.S. Pat. No. 4,367,924, issued to Clark et al. discloses an electro-optical device which utilizes the strong coupling of the molecular orientation of the liquid crystal to an applied electric field. Tilted chiral smectic liquid crystal material is disposed between flat plates spaced by a sufficiently small distance to ensure unwinding of the helix formed by the molecules of the liquid crystal in bulk. As a result, the liquid crystal assumes one of two stable states which can be switched by reversing the polarity of an externally applied electric field, thus forming a bistable light valve. This type of bistable light valve, which employs surface interactions to stably unwind the spontaneous ferroelectric helix, is known as a Surface Stabilized Ferroelectric Liquid Crystal (SSFLC) device.

Such a bistable light valve has been used to develop electro-optic shift registers which propagate data through an LCD array. For example, U.S. Pat. No. 4,815,035 issued to Brooks discloses a scrolling liquid crystal light modulator having an LCD array having different optical states propagated by a plurality of electrodes located along the array. The LCD cells each have three bias levels having three distinct functions: a high bias level which switches the LCD cell to the ON state; a low bias level which immediately extinguishes the ON state (e.g., to an OFF state); and an intermediate bias level which results in an ON state in the LCD cell only if the immediately preceding adjacent cell is in the ON state. Thus, the intermediate bias level permits propagation of data from one cell to the next adjacent cell.

FIGS. 1A to 1F correspond to FIGS. 2A to 2F of U.S. Pat. No. 4,815,035. As shown in FIG. 1A, an input liquid crystal cell assumes an assigned optical state (ON) during Phase 1 in response to the input signal (H) applied to electrode 16. The assigned optical state of the input liquid crystal cell is then propagated by applying to the subsequent LCD cells a three-phase pulse sequence. Specifically, during Phase 2 as shown in FIG. 1 the electrode 18a adjacent to the input electrode 16 switches to a medium bias (M) so that the optical state (ON) is propagated to cover both electrodes 16 and 18a. During Phase 3 as shown in FIG. 1C the input electrode 16 applies a second input signal (L) which extinguishes the input liquid crystal cell to another optical state (OFF); also, the next adjacent electrode 18b switches from a low bias (L) to a medium bias (M) to propagate the optical state (ON) to the LCD cell affected by the electrode 18b The three phase cycle thereafter repeats itself, so that data represented by the optical states can be propagated along the LCD array.

Although U.S. Pat. No. 4,815,035 to Brooks discusses in general electro-optic shift registers, Brooks fails to teach any specific relationship between the electrode spacing, the cell thickness and electromagnetic fields within the cell; thus, these factors associated with domain wall propagation must be more carefully considered so that those of ordinary skill in the art may consistently create LCD cells in which domain walls are accurately and reliably propagated.

SUMMARY OF THE INVENTION

It is an object of the present invention to provide an efficient electro-optic shift register which provides a high propagation speed.

It is a further object of the present invention to provide an electro-optic shift register which propagates data with a higher degree of accuracy and reliability.

It is still a further object of the present invention to utilize the proximity effects of individual pixels, namely that the states of neighboring pixels influence the switching threshold of a given pixel.

The present invention provides an arrangement (apparatus and method) for electro-optically storing and propagating data using a proximity effect in a linear pixel array of bistable electro-optic SSFLC light valves. The proximity effect is defined herein as the influence of the optical state of adjacent pixels on the electric field threshold for switching a given pixel between different optical states. In this invention, the proximity effect is implemented by providing two planes, spaced by a distance S1, one containing a continuous electrode, and the other containing a plurality of electrodes, whereby the SSFLC film fills the space between the planes, whereby the gap between electrodes on the one plane, S2, is narrower than the spacing between the planes, S1.

A domain wall, defined as the boundary between adjacent groups of pixels of opposite optical state (i.e., molecular orientation), is located over the gap between the electrodes of the adjacent pixels, each pixel being defined by the length of its respective electrode. By sufficiently reducing the pixel gap S2 relative to the SSFLC film thickness S1, the domain wall width, which is comparable to the SSFLC film thickness, will overlap the pixels. The electric field of one electrode affects the domain wall between that electrode and an adjacent electrode, so that the domain wall can be propagated by applying to the one electrode of a pixel a voltage sufficient to cause motion of the domain wall. Thus, if a pixel having an optical orientation (UP) is surrounded by two adjacent pixels having an optical orientation (DOWN), the optical orientation (UP) representing a data value can easily be propagated to an adjacent target pixel by appropriate voltage sequencing on the electrodes corresponding to the pixels.

Thus, the present invention enables storage and propagation of data in an electro-optical storage device whereby only one pixel is needed to store a data value. The result is a faster, more compact electro-optic shift register.

The present invention achieves these functions by providing an apparatus having ferroelectric liquid crystal such as SSFLC sandwiched between a pair of planes.

At least one of the planes has a plurality of electrodes separated by electrode gaps narrower than the plane spacing. The gaps are sufficiently narrow to enable the formation of domain walls between the pixels which overlap the pixels, whereby the pixels are defined by the length of the respective electrode. Since an electric field can extend beyond the edge of each electrode into the electrode spacing, the overlapping domain wall can be propagated efficiently by its adjacent electrode because the corresponding electric field acts on a greater portion of the domain wall. This procedure, defined by the inventors as the "proximity effect", improves reliability of data as represented by the propagation of optical states in the LCD.

The present invention also provides a method for propagating data within the above-mentioned apparatus which includes a first, second and third adjacent pixel having first, second and third respective electrodes arranged to generate the proximity effect, the first and third pixels having an optical orientation (DOWN) and the second pixel having an optical orientation (UP). The method within this apparatus includes the steps of applying a first bias to the third electrode, and, after applying the first bias, applying a second bias simultaneously to the first and second electrode, thereby propagating the datum from the second pixel to the third pixel.

The present invention may be applied to different electrode geometries and to different types of layer structures of the SSFLC cells. For example, the features of the present invention may be applied to the domain walls on the chevron interface for chevron SSFLC cells (See Clark et al., FERROELECTRICS, Vol. 85, page 79 (1988), or to tilted layer cells (See Handschy et al. FERROELECTRICS, Vol. 59, p. 69 (1984)).

Thus, the present invention by using the proximity effect offers a faster, more efficient and ultimately more reliable electro-optical shift register.

BRIEF DESCRIPTION OF THE DRAWINGS

A preferred embodiment of the invention will be described in detail with reference to the drawings wherein like reference numerals denote like or corresponding parts throughout, wherein:

FIG. 8 shows another embodiment of the present invention.

DETAILED DESCRIPTION OF THE PREFERRED EMBODIMENT

The present invention uses a Surface Stabilized Ferroelectric Liquid Crystal (SSFLC) device as part of the electro-optic shift register A detailed description of SSFLC devices is found in U.S. Pat. No. 4,367,924, issued on Jan. 11, 1983 to Clark et al. and in U.S. Pat. No. 4,563,059 issued on Jan. 7, 1986 to Clark et al, both of which are incorporated herein by reference. The following description is sufficient for the purposes of describing the features of the present invention.

Figure 1A:
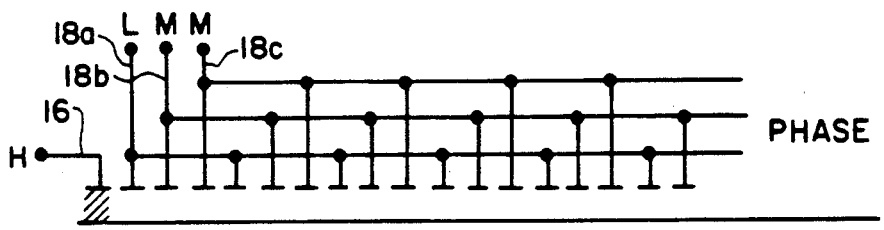
FIGS. 1A–1F show a data propagation sequence in a conventional electro-optical shift register.
Figure 1B:
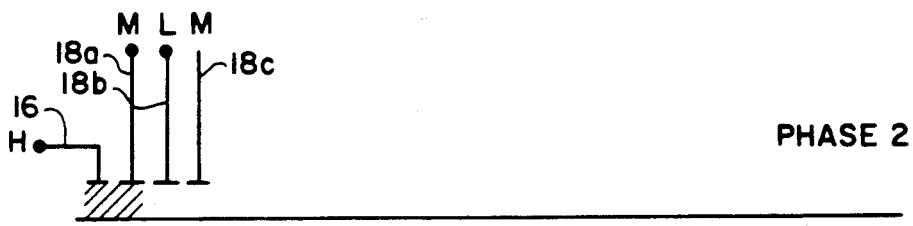
Figure 1C:
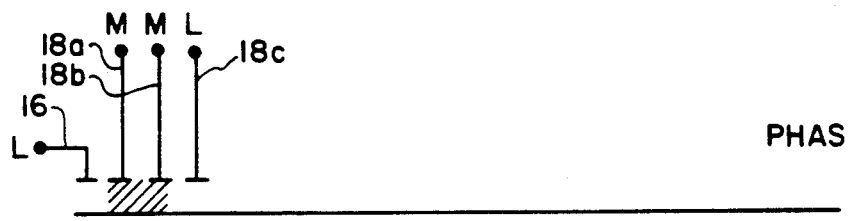
Figure 1D:
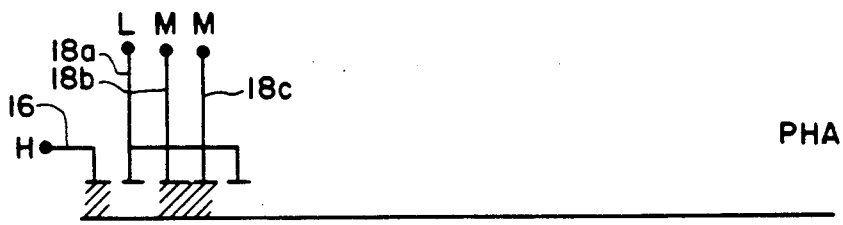
Figure 1E:
Figure 1F:
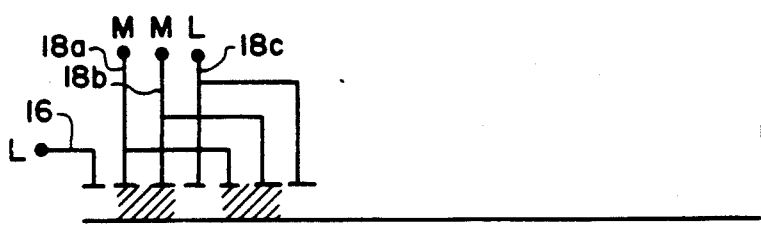
Figure 2:
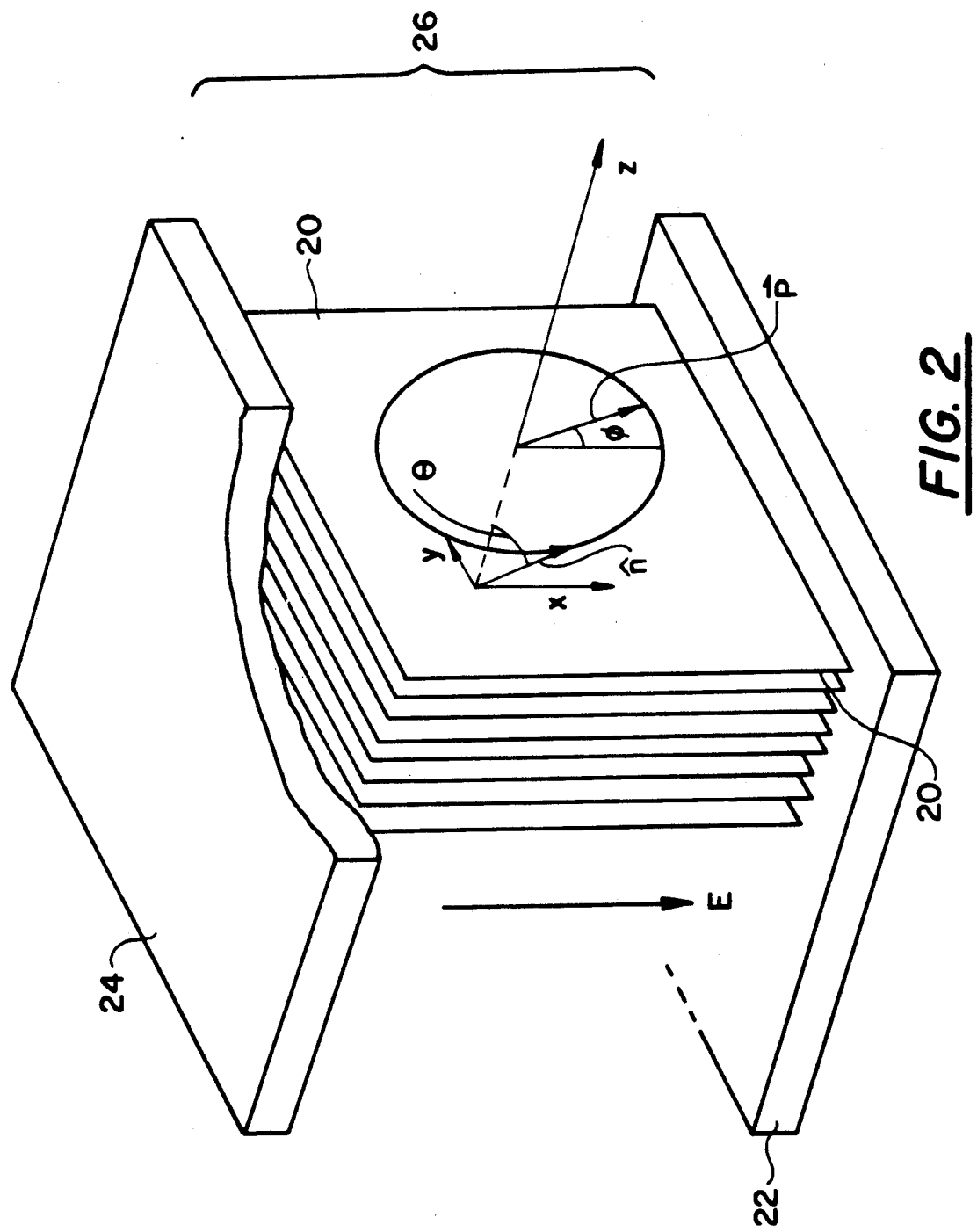
FIG. 2 shows an example of SSFLC geometry with layers normal to the bounding plates.

FIG. 2 shows an SSFLC film 26 with smectic layers 20 substantially normal to electroconductive plates 22 and 24. The FLC phase is a layered phase with a molecular long axis ($\hat{n}$) tilted with respect to the local layer normal ($\hat{z}$) by a temperature dependent tilt angle ($\Theta$). Since there is no constraint on the molecules in the azimuthal direction ($0 < \phi < 2\pi$), the molecules may lie in a cone defined by the tilt angle ($\Theta$). The tilt of the molecules with respect to $\hat{z}$ gives rise to a spontaneous ferroelectric polarization vector $\vec{P}$ normal to both $\hat{z}$ and $\hat{n}$ (e.g., $\vec{P} = k\hat{z} \times \hat{n}$).

In SSFLC geometry the layers of the liquid crystal are oriented nearly normal to the bounding plates 22 and 24. The bounding surfaces of plates 22 and 24 stabilize two orientations of the director field for which the polarization vector $\vec{P}$ has either an UP orientation ($\phi \approx 0$) or a DOWN orientation ($\phi \approx \pi$). The two orientations may be selected by applying an electric field $\vec{E}$ generated by above-threshold voltage pulses applied to the electrically conductive plates 22 and 24. The bistable light valve is formed by rendering the two orientations optically distinct (e.g., UP transmitting and DOWN opaque). This may be accomplished by arranging the two bounding plates 22 and 24 between polarizers (not shown), for example.

Figure 3:
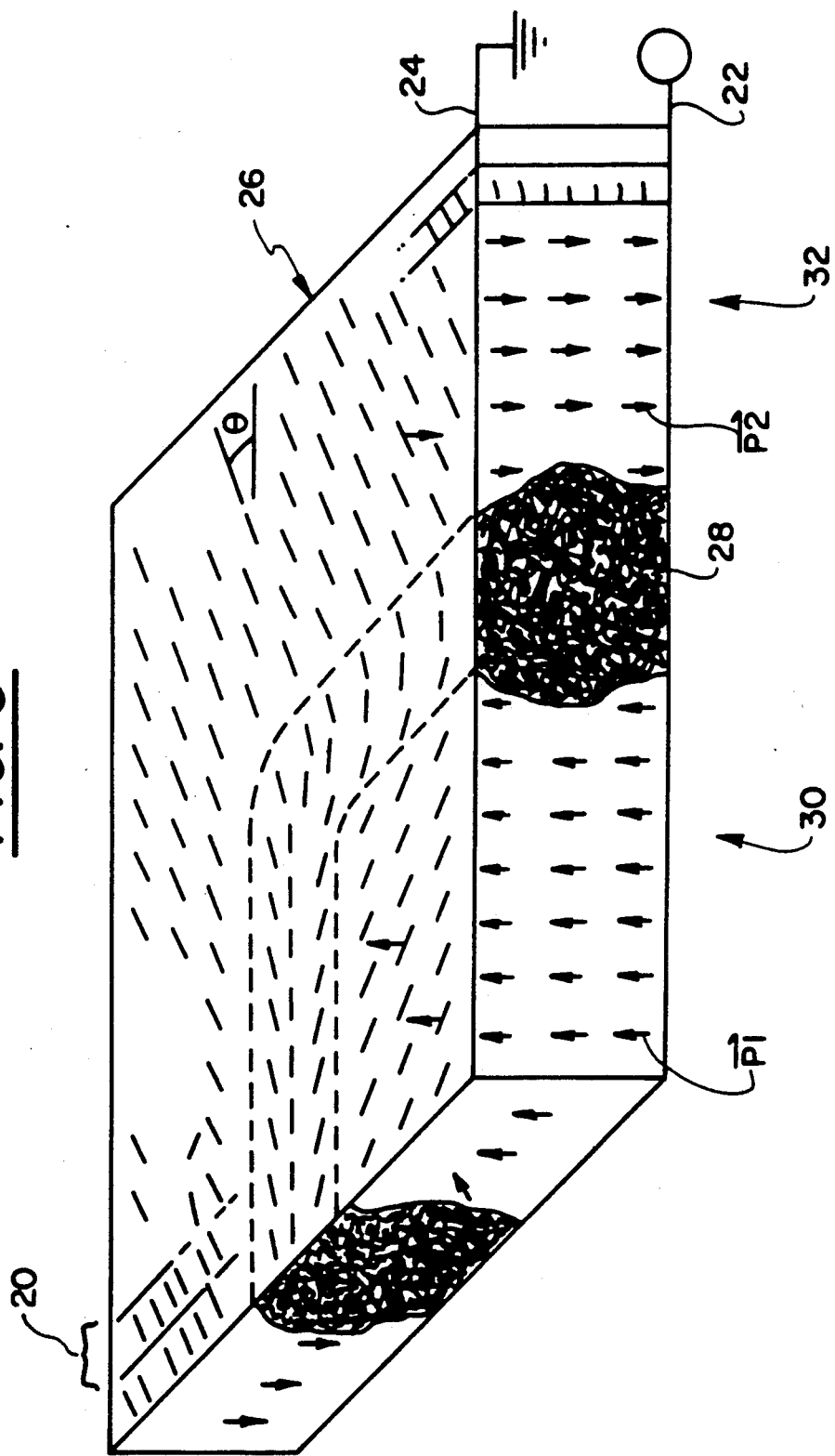
FIG. 3 shows an exemplary SSFLC structure having a domain wall in accordance with the present invention.

FIG. 3 shows SSFLC film 26 having layers normal to boundary plates 22 and 24 and a domain wall 28. The SSFLC film 26 is made up of a plurality of individual SSFLC layers 20. The domain wall 28 separates a first stabilized state 30 having a first molecular orientation for which polarization vector $\vec{P}$ points UP ($\phi \approx 0$) (P$\vec{1}$) from a second stabilized state 32 having a second molecular orientation for which polarization vector $\vec{P}$ points DOWN ($\phi \approx \pi$) (P$\vec{2}$). The domain wall spans the spacing between the plates 22 and 24, and has a width comparable to this spacing. The thickness of the SSFLC film 26 is, for example, 4 $\mu$m. The electrodes 22 and 24 generate the electric field $\vec{E}$ to reorient the SSFLC.

Figure 4A:
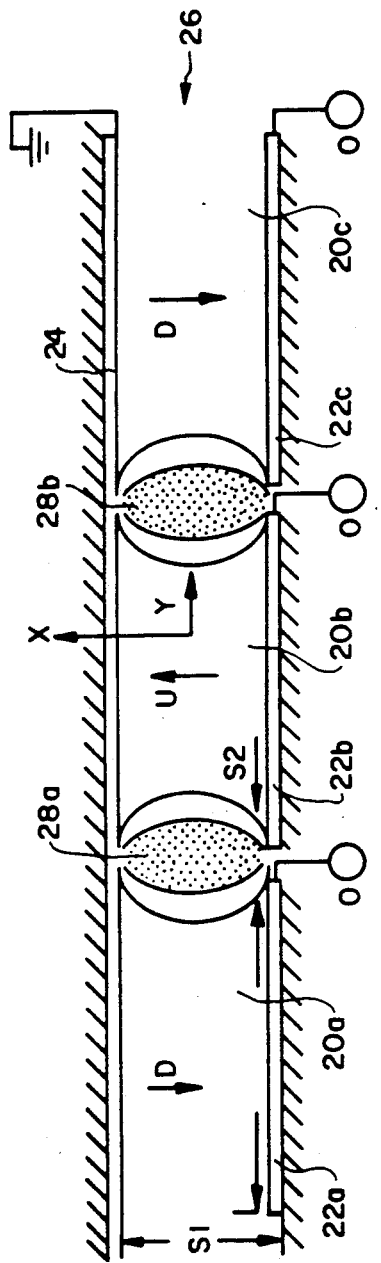
FIGS. 4A to 4C show a data propagation sequence according to a preferred embodiment of the present invention.
Figure 4B:
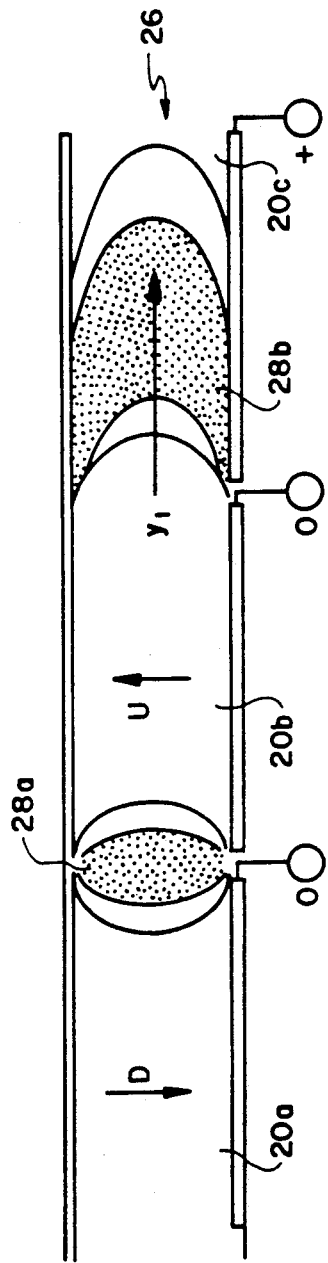
Figure 4C:
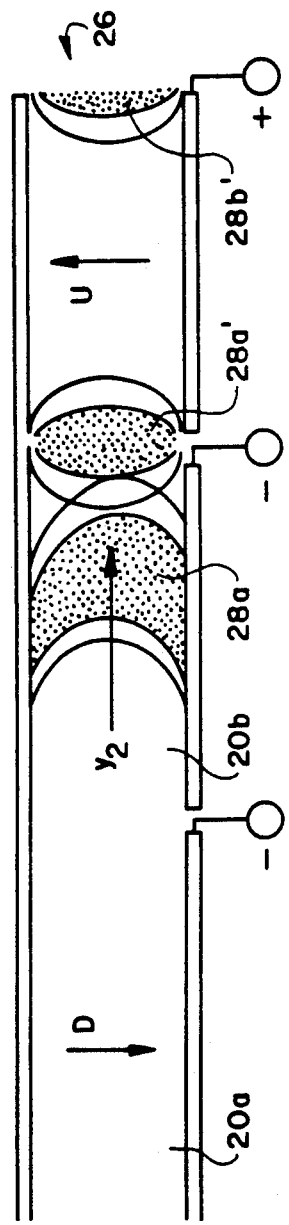

FIGS. 4A, 4B and 4C illustrate a sequence of propagating data according to a preferred embodiment of the present invention. As shown in FIG. 4A, the preferred embodiment includes a liquid crystal film 26 located between electrode 24 which is grounded and a plurality of electrodes 22a, 22b and 22c, separated by gaps of width S2. Liquid crystal 26 has a thickness S1 of, for example, 4 $\mu$m between the conducting plates 22 and 24. The domain wall 28 occupies the total thickness S1 of liquid crystal 26, and has a comparable width along y. As a result, the domain wall will overlap the adjacent pixel cells 20, when S2<S1.

Each pixel cell 20a, 20b and 20c corresponds to electrodes 22a, 22b and 22c, respectively. Each electrode 22a, 22b and 22c has a width of, for example, 20 $\mu$m. The gap S2 between each electrode, for example the gap between the electrode 22a and 22b, is less than the thickness S1 of liquid crystal 26. This arrangement of providing an electrode spacing S2 narrower than the spacing S1 between the conducting plates 22 and 24 (also referred to as the "plate spacing"), enables the present embodiment to exhibit the "proximity effect" of the domain walls 28.

The proximity effect can be described as follows. Suppose cells 20a and 20c each have a DOWN orientation, whereas cell 20b has an UP orientation as illustrated in FIG. 4A. The cell 20b having an UP orientation is bounded by two domain walls 28a and 28b. The domain walls 28a and 28b represent the region of continuous reorientation of the molecular long axis n between the polarization states UP and DOWN, where $\phi \approx 0$ and $\phi \approx \pi$, respectively. The domain walls 28a and 28b are trapped between pixel cells 20a, 20b and 20c because the liquid crystal material is resistive to domain wall movement. The electric potential V varies smoothly in the gaps between the pixels (see FIG. 6, described below). As indicated earlier, the domain wall 28a overlaps pixel cells 20a and 20b, whereas the domain wall 28b overlaps into pixel cells 20b and 20c. Therefore, the electric fields generated by voltages on the pixel electrodes can initiate domain wall motion.

In an additional important embodiment, as shown in FIG. 8, the pixel gap can be effectively reduced by extending each pixel electrode 22 into the gap using a low, but nonzero, conductivity material 100. If this material 100 spans the gap, then the gap thickness, although actually S2, effectively becomes zero, meaning that a domain wall located at the center of the gap can be influenced to move by voltages applied to the adjacent electrodes even if $S1 < S2$. This is because the low conductivity material in the gap will carry the electric field of the electrodes into the gap.

Referring to FIG. 4B, the pixel cell 20b has an orientation UP. The movement of domain wall 28b across the pixel cell 20c in the rightward Y direction is initiated by applying a positive voltage V1 to the corresponding electrode 22c. After the domain wall 28b has moved in a direction y1 as shown in FIG. 4B to be over electrode 22c, the next domain wall 28a is moved by applying a negative voltage V2 simultaneously to electrodes 22a and 22b. After the domain wall 28a has begun moving, the domain wall 28b comes to rest at the electrode gap between the electrode 22c and an adjacent electrode (not shown) as a domain wall 28b'. As shown in FIG. 4C, the application of the negative voltage V2 on the electrodes 22a and 22b causes the domain wall 28a to move in a direction y2 to the electrode gap between electrodes 22b and 22c and come to rest as indicated by domain wall 28a'.

Therefore, as shown in FIGS. 4A, 4B and 4C, the propagation of data by movement of the domain walls arises from the following sequence. Assuming the data is to move in the rightward Y direction, the positive voltage V1 is applied to the electrode 22c which is to the right of the right-most domain wall 28b. The domain wall 28b, which initially overlaps the electrode 22c before application of the positive voltage V1, moves in a direction y1 across the pixel defined by the electrode 22c. Once the domain wall 28b has begun movement, the next domain wall 28a begins movement in the y2 direction by the simultaneous application of a negative pulse V2 to electrodes 22a and 22b. The first domain wall 28b completes movement in the y1 direction and comes to rest as the domain wall 28b' as the domain wall 28a is moving in the y2 direction. Finally, the domain wall 28a comes to rest as the domain wall 28a', thereby completing the data propagation sequence.

In a variation of the above sequence, the propagation of the domain wall 28a can be delayed until after the domain wall 28b comes to rest as the domain wall 28b'.

It should be noted that while the voltage V1 may be experimentally determined based upon desired propagation speed and the geometry of the SSFLC array 26, the voltage V1 is less than the threshold voltage necessary to nucleate a new domain wall because the domain wall 28b need only be moved. The negative voltage V2, however, has a greater absolute value than the threshold value of the SSFLC film 26. Thus, if the data pixel 20b was in a DOWN state, there would be no response to the positive pulse V1 and the data pixel 20b would remain in a DOWN state. However, if a domain wall is present, the voltage V1 is sufficient to cause movement of the domain wall. As is known to those skilled in the art, the threshold voltages depend on the duration of their application.

It should be apparent from FIGS. 4A, 4B and 4C that the propagation of data according to the present invention utilizes at least one data pixel and two spacer pixels. However, the size of these pixels can be minimized to as small as 20 μm with an SSFLC film thickness of 4 μm.

Figure 5A:
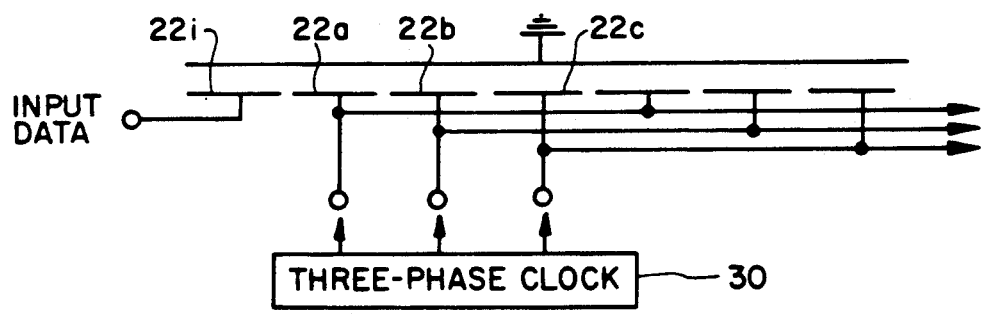
FIGS. 5A and 5B illustrate the electrodes of the preferred embodiment.
Figure 5B:
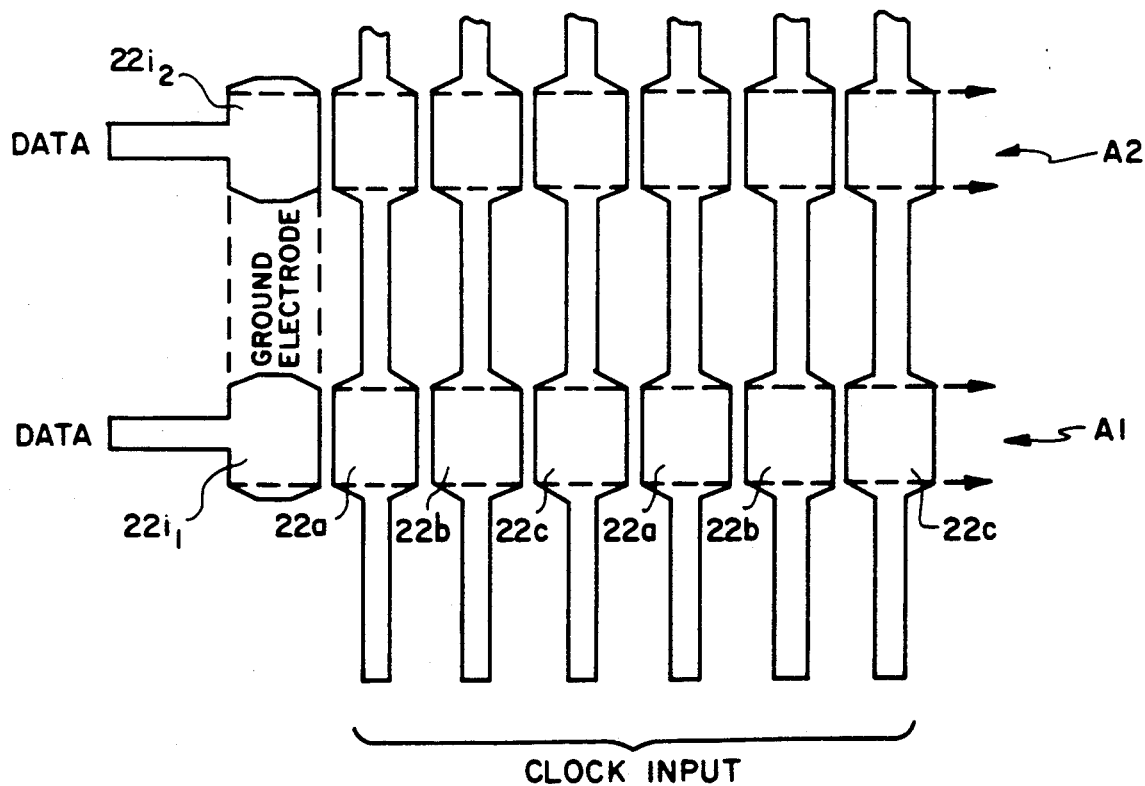

FIGS. 5A and 5B show the respective front and top views of the electrodes of the preferred embodiment. Specifically, FIG. 5A shows the electrical connection of electrodes 22a, 22b and 22c to a three phase clock 30. The three phase clock applies the appropriate voltages V1 and V2 to the electrodes 22a, 22b and 22c at preselected intervals to provide the data propagation sequence shown in FIGS. 4A, 4B and 4C. Data is input via an input electrode 22 which applies a voltage pulse above the threshold voltage for a positive data value, and a negative voltage pulse below the threshold value for a negative data value.

FIG. 5B shows a top view of the present embodiment. Since the electrodes 22a, 22b and 22c serve only as clocking electrodes, a plurality of data arrays A1 and A2 may be utilized on the same SSFLC array 26. The data arrays A1 and A2 store the data input by the electrodes $22i_1$ and $22i_2$, respectively.

Figure 6:
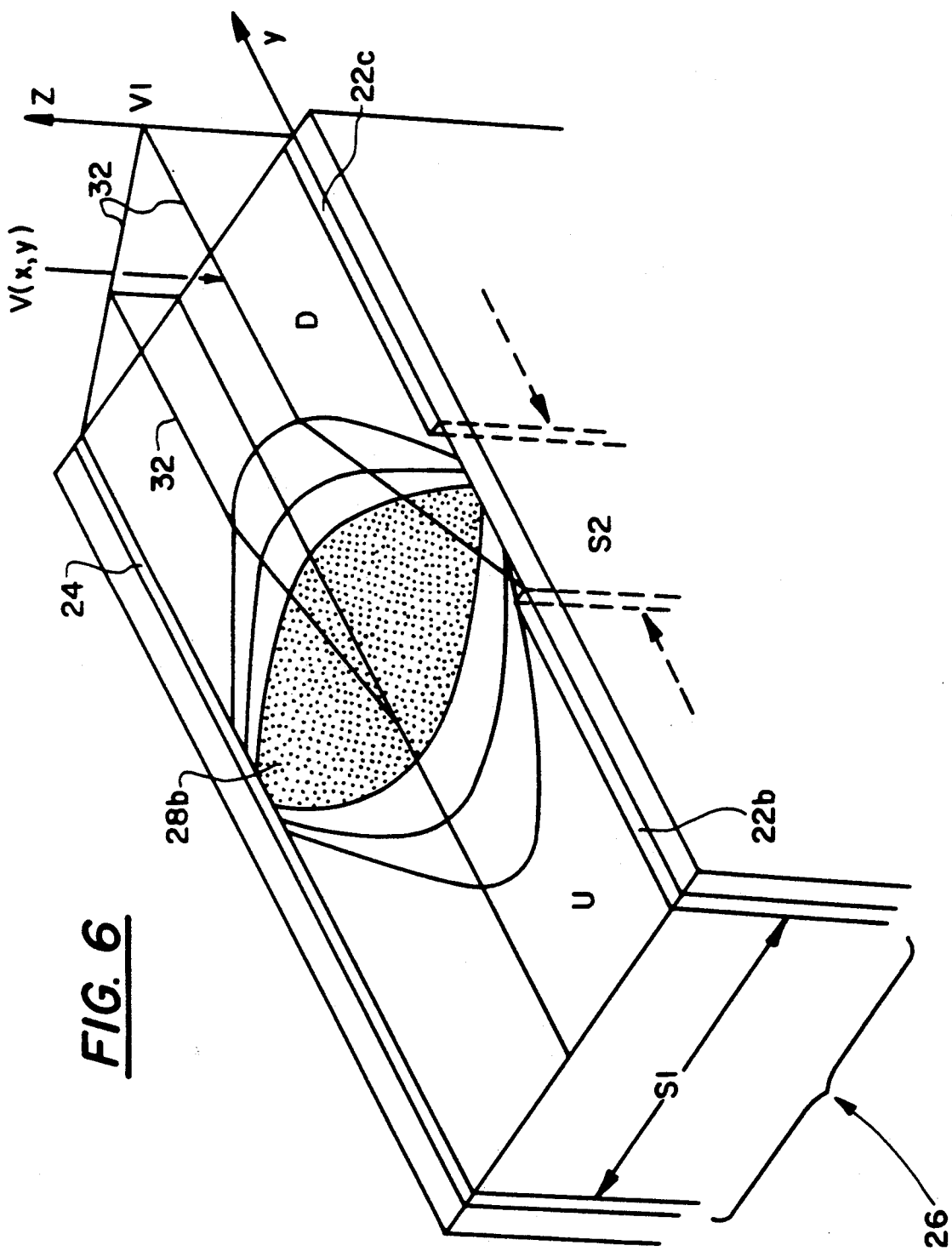
FIG. 6 illustrates a voltage differential between adjacent pixels bounded by a domain wall according to the preferred embodiment of the present invention.

FIG. 6 illustrates the electrostatic potential or voltage distribution, V(x,y) within the SSFLC array 26. When the voltage V1 is applied to the electrode 22c, a voltage gradient is formed between electrode 22c and the electrodes 22b and 24. As shown by the voltage contour lines 32, the domain wall 28b overlaps regions of nonzero potential corresponding to the electrode 22c. In addition, the electric field generated by the electrode 22c extends into the electrode gap S2. Thus, the domain wall 28b is propagated by the desired proximity effect caused by the overlapping of the domain wall with the regions of nonzero electric field.

Figure 7:
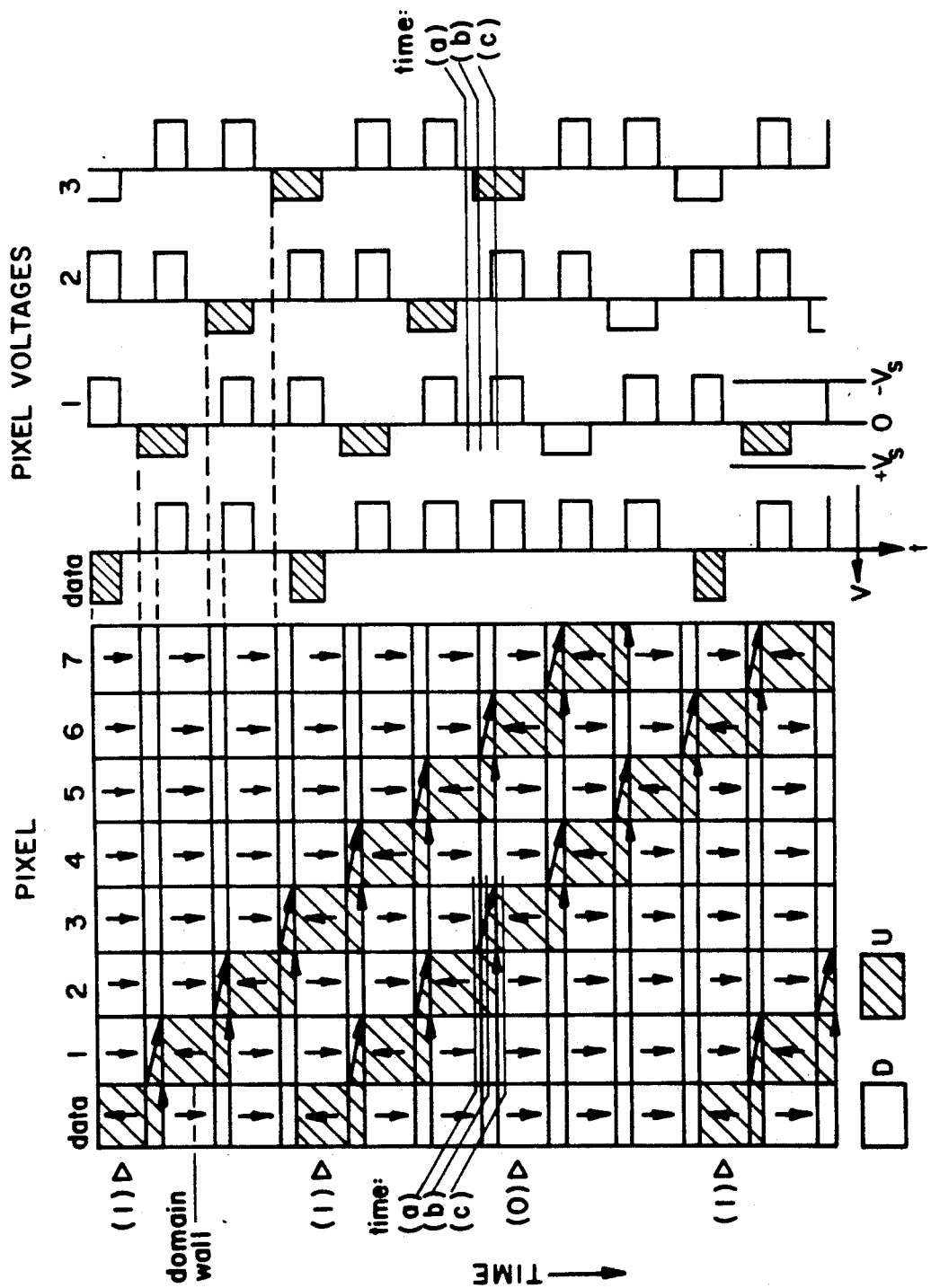
FIG. 7 shows a sequence of data being propagated along an SSFLC array according to the preferred embodiment.

FIG. 7 shows a sequence of data being propagated over time along an SSFLC array according to the preferred embodiment. The hatched areas within the propagation sequence indicate that the trailing domain wall does not begin propagation until after the leading wall begins to move. The input sequence 1101 (UP, UP, DOWN, UP) is propagated using the three-phase clock cycle shown in FIG. 5A. The times (a), (b) and (c) in FIG. 7 correspond to FIGS. 4A, 4B and 4C, respectively. As shown in FIGS. 7 and 4A, pixel 2 holds a data value UP at time (a). The voltages on pixels 1, 2 and 3 (corresponding to pixels 20a, 20b and 20c in FIG. 4A) are at a zero level at time (a). At time (b), voltage V1 is applied to pixel 3 (pixel 20c in FIG. 4B) to move the domain wall 28b in the y1 direction. Note that at time (b) in FIG. 7 the data UP temporarily spans two pixel lengths. At time (c) the negative pulse V2 is applied to pixels 1 and 2 (pixels 20a and 20b in FIG. 4C) to shift the trailing edge of the UP data.

For the data input (0) which has an orientation DOWN, the clock cycles which include voltages V1 and V2 do not change the orientation DOWN of the pixels because the voltage V1 is less than the threshold voltage $+V_5$. Thus, the pixel state remains in a DOWN orientation.

The above embodiment has been successfully tested experimentally. A prototype cell having the SSFLC geometry comprised a linear array of 32 rectangular pixels 400 μm long by 20 μm wide, having connecting lines from each pixel to a driving circuit. The electrode gap S2 was 2 μm and the electrode width was 20 μm. The opposing electrode plate 24 covered the length of the pixel array. The pixels and connecting lines were patterned by etching indium tin oxide (ITO) coated glass using optical lithography techniques. Connecting lines were patterned in evaporated aluminum to reduce series resistance. Both electrode plates were coated with a DuPont Elvamide layer which was rubbed to align the molecular orientation ñ in the plane of the bounding plates upon cooling into the smectic A phase. The plates were assembled by being clamped in a machined aluminum holder, whereby a 4 μm spacer was between the two plates to make S1 about 4 μm. The resulting cell was filled with a commercial room-temperature FLC mixture (50%W7–50%W82 from Displaytech, Inc., Boulder, Colo.) in the isotropic phase, which cooled to the smectic C phase. The smectic C phase ranges from 21 degrees C to 49 degrees C, with a room temperature response time of 150 μs at 15V/μm.

The prototype successfully demonstrated the effects of the disclosed embodiment. It should be noted that position dependent variations in the threshold properties of the pixel may arise if there exist localized defect structures in the liquid crystal and variations in the surface treatment. Uniform threshold characteristics will be obtained as SSFLC cells are made to eliminate such defect structures and surface treatment variations.

While this invention has been described in connection with what is presently considered to be the most practical and preferred embodiment, it is to be understood that the invention is not limited to the disclosed embodiment. For example, the SSFLC may be modified to be of the chevron type or tilted layer type. Also, various clocking sequences may be used so long as the domain walls propagate in a single direction. Therefore, this invention is also intended to cover various modifications and equivalent arrangements included within the spirit and scope of the appended claims.

What is claimed is:

1. An apparatus for electro-optically storing and propagating data in response to input data comprising:
    a liquid crystal film disposed between first and second planes defining a plane spacing and cooperating with surface treatments to achieve any one of at least two stable states;
    a plurality of electrode means, disposed proximate to said liquid crystal film, for creating electric fields in said liquid crystal film, said plurality of electrode means including an input electrode means for receiving said input data, said plurality of electrode means having a predetermined electrode gap therebetween and defining a plurality of pixels in said liquid crystal film, said liquid crystal film being capable of forming a domain wall between two of said pixels, said electrode gap and plane spacing causing an electric field generated by each of said electrode means to occupy a portion of the volume occupied by said domain wall, said electric field inducing a proximity effect on said domain wall; and
    timing means for generating timing signals to said plurality of electrode means so as to propagate said domain wall in a predetermined direction by said proximity effect.

2. An apparatus as recited in claim 1, wherein said liquid crystal film is surface stabilized and includes ferroelectric smectic C liquid crystal.

3. An apparatus as recited in claim 1, wherein:
    said plurality of electrode means include first, second and third electrode means arranged sequentially;
    said timing means outputs a first timing signal to said first electrode means and then a second timing signal simultaneously to said second and third electrode means, said first timing signal having an absolute value less than a first threshold and greater than a minimum threshold to propagate said domain wall using said proximity effect, said first threshold changing said liquid crystal film from a first of said stable states to a second of said second stable states without using said proximity effect, said second timing signal having an absolute value greater than a second threshold, said second threshold causing said liquid crystal film to remain in said first stable state despite said proximity effect.

4. An apparatus as recited in claim 3, wherein said plurality of electrode means receive a zero potential from said timing means prior to said first timing signal.

5. An apparatus as recited in claim 3, wherein said second timing signal is output to said second and third electrode means after said domain wall has propagated from said electrode gap corresponding to said two pixels to an adjacent electrode spacing.

6. An apparatus as recited in claim 3, wherein said input electrode means acquires a voltage corresponding to said second timing signal after receiving said input data.

7. An apparatus as recited in claim 1, wherein said liquid crystal film is a chevron type.

8. An apparatus as recited in claim 1, wherein said electrode gap is narrower than said plane spacing.

9. An apparatus as recited in claim 8, wherein said electrode gap is 2 μm and said plane spacing is 4 μm.

10. A method for optically propagating data comprising the steps of:
    inputting a data signal to an input electrode means of an apparatus comprising a liquid crystal film disposed between first and second planes defining a plane spacing whereby said liquid crystal film cooperates with surface treatments to achieve any one of at least two stable states, a plurality of electrode means for creating electric fields in said liquid crystal film and having a predetermined electrode gap therebetween, said liquid crystal film being capable of forming a domain wall at one of said electrode gaps said electrode gap and plane spacing causing an electric field generated by each of said electrode means to occupy a portion of the volume occupied by said domain wall to induce a proximity effect on said domain wall, said input electrode means being one of the plurality of electrodes;

first creating a first electric field with a first of said plurality of electrode means, said first electric field being less than is necessary to switch said liquid crystal film from a first of said stable states to a second of said stable states absent said proximity effect, but being sufficient to switch said liquid crystal film from said first stable state to said second stable state with said proximity effect, said first electrode being adjacent to said input electrode; and second creating a second electric field with said input electrode after said first creating step, said second electric field being sufficient to change stable states of said liquid crystal film with or without said proximity effect.

11. A method as recited in claim 10, further comprising the steps of:

third creating said first electric field with a second of said plurality of electrode means after said second creating step, said second electrode means being adjacent to said first electrode means;

repeating said second creating step after said third creating step; and fourth creating said second electric field with said first electrode means simultaneously with said repeated second creating step.

12. A method as recited in claim 11, further comprising the steps of:

fifth creating said first electric field with a third of said plurality of electrode means after said fourth creating step, said third electrode means being adjacent to said second electrode means;

sixth creating said second electric field with said first and second electrode means simultaneously; and inputting a second data signal to said input electrode means simultaneously with said sixth creating step.

13. A method for optically propagating data input by an input electrode means comprising the steps of:

first creating a first electric field with a first of a plurality of electrode means adjacent to said input electrode means, said plurality of electrode means being part of an apparatus comprising a liquid crystal film disposed between first and second planes defining a plane spacing whereby said liquid crystal film cooperates with surface treatments to achieve any one of at least two stable states, said plurality of electrode means creating electric fields in said liquid crystal film and having a predetermined electrode gap therebetween, said liquid crystal film being capable of forming a domain wall at one of said electrode gaps, said electrode gap and plane spacing causing an electric field generated by each of said electrode means to occupy a portion of the volume occupied by said domain wall to induce a proximity effect on said domain wall, said first electrode means being separated from said input electrode means by said predetermined electrode gap, said first electric field being less than is necessary to switch said liquid crystal film from a first of said stable states to a second of said stable states absent said proximity effect, but being sufficient to switch said liquid crystal film from said first stable state to said second stable state with said proximity effect; and second creating a second electric field with a second and an adjacent third electrode means after said first creating step, said second electric field being sufficient to change stable states of said liquid crystal film with or without said proximity effect, said second electrode means being adjacent to said first electrode means.

14. A method as recited in claim 13, wherein said first creating step propagates a domain wall across said first electrode means from an electrode gap between said first and second electrode means, and said second creating step propagates a second domain wall across said second electrode means from an electrode gap between said second and third electrode means, said first and second domain wall forming a data value.

15. The apparatus as recited in claim 1, wherein said liquid crystal film is a tilted layer type.

16. An apparatus as in claim 1, wherein said electrode gap is spanned by a resistive layer.

* * * * *